United States Patent [19]

Hsu et al.

[11] 4,314,525

[45] Feb. 9, 1982

[54] FLUIDIZED BED SILICON DEPOSITION FROM SILANE

[75] Inventors: George C. Hsu, La Crescenta; Harry Levin, Woodland Hills; Richard A. Hogle, Arcadia; Ananda Praturi, Monrovia; Ralph Lutwack, Sunland, all of Calif.

[73] Assignee: California Institute of Technology, Pasadena, Calif.

[21] Appl. No.: 126,324

[22] Filed: Mar. 3, 1980

[51] Int. Cl.³ .............................................. C23C 13/08
[52] U.S. Cl. ...................... 118/716; 422/198; 427/213; 427/86; 423/349
[58] Field of Search .................. 118/716, DIG. 5; 423/349, 350; 422/198; 427/213, 86

[56] References Cited

U.S. PATENT DOCUMENTS 2,915,367  12/1959  Olson ................................ 422/158
4,207,360   6/1980  Padovani ........................... 427/213

FOREIGN PATENT DOCUMENTS 63772   1/1961  Canada ................................ 423/349
4024163 10/1965  Japan .................................. 423/350

*Primary Examiner*—Sam Silverberg
*Attorney, Agent, or Firm*—Marvin E. Jacobs

[57] ABSTRACT

A process and apparatus for thermally decomposing silicon containing gas for deposition on fluidized nucleating silicon seed particles is disclosed.

Silicon seed particles are produced in a secondary fluidized reactor by thermal decomposition of a silicon containing gas. The thermally produced silicon seed particles are then introduced into a primary fluidized bed reactor to form a fluidized bed. Silicon containing gas is introduced into the primary reactor where it is thermally decomposed and deposited on the fluidized silicon seed particles. Silicon seed particles having the desired amount of thermally decomposed silicon product thereon are removed from the primary fluidized reactor as ultra pure silicon product.

An apparatus for carrying out this process is also disclosed.

17 Claims, 2 Drawing Figures

FLUIDIZED BED SILICON DEPOSITION FROM SILANE

ORIGIN OF THE INVENTION

The invention described herein was made in the performance of work under a NASA contract and is subject to the provisions of Sections 305 of the National Aeronautics and Space Act of 1958, public law 83-568 (72 Statute 435; 42 U.S.C. 2454).

BACKGROUND OF THE INVENTION

1. Field of the Invention

The present invention relates to the production of silicon and more particularly to an improved system for the production of solar grade silicon by the thermal decomposition of silane.

2. Description of the Prior Art

Self sufficiency in energy is a stated national goal. Most of the proposed means to achieve this goal are either environmentally unacceptable or are not feasible, especially those not depending on fossil fuel sources. Of the available alternatives, solar energy is the most abundant, inexhaustable single resource available. However, capturing and utilizing solar energy is not simple. Methods are being sought to convert solar energy to a concentrated, storable form of energy. A known method, photosynthesis, converts somewhat less than 1% of the suns energy at the earths surface to a solid fuel, i.e., plant materials, which when accumulated and transformed over geologic ages yielded fossil fuels. Current rates of use of these fossil fuels, and the particular geographic distribution and political control of major petroleum resources pose problems for nations that are net petroleum consumers. An alternate method yielding a simpler fuel, at a higher conversion, has long been desired.

One method of converting solar energy to a usable form being prominently considered is the development of large arrays of photovoltaic solar cells, especially in the sunbelt areas such as the southwestern and western regions of the United States. The most promising candidate for the solar cell is a doped silicon sheet material and silicon is one of the most plentiful elements in the earth's crust.

The most abundant source of silicon is silica sand. Metallurgical silicon can be made cheaply from sand in an arc furnace by reaction with carbon to produce silicon and $CO_2$. This material, however, is far too impure for use in solar cells. To purify this material, the silicon can be converted to a gaseous product where distillation and adsorption can be used for purification. For example, metallurgical silicon will react with chlorine to produce $SiCl_4$ gas. This gas can be converted to silicon using a reductant such as zinc, as studied by Battelle Memorial Institute, or to silane gas, $SiH_4$, by a redistribution reaction with hydrogen. This highly pure silane gas can then be thermally decomposed to silicon and hydrogen.

The thermal decomposition of highly pure silane gas to produce silicon is preferred over the formation of silicon from $SiCl_4$. The silane thermal decomposition reaction is preferred due to its simplicity, potential purity (no zinc or other reactant), and the relatively mild conditions of reaction.

A major problem present in producing high purity silicon by thermally decomposing chlorosilane gas is that known processes include inherently wasteful or inefficient energy consumption steps. For example, the Siemens process for the production of high purity silicon on heated rod surfaces has inherent massive heat losses.

The current energy crisis has especially focussed attention on the major deficiencies of these conventional chlorosilane thermal decomposition processes, where huge expenditures of energy are required per pound of product. The need for new processes to produce high purity silicon in great volume, high efficiency or yield and at very low overall energy expenditure levels is expected to become more critical as the world turns to more widespread use of silicon solar energy collection systems.

An approach which has been taken to overcome the inherent energy waste present in prior processes utilizes a fluidized bed reactor (FBR) for thermally decomposing silane. Fluidized bed reactors are well known for their excellent heat and mass transfer characteristics.

Examples of fluidized bed reactor utilization to thermally decompose silane to form silicon are disclosed in U.S. Pat. Nos. 3,012,861 and 3,012,862.

These patents disclose use of a fluidized bed of ultra pure silicon seed particles on which silicon is deposited during thermal decomposition of silane, chlorosilanes or other halo silanes within the fluidized bed. The silanes are introduced along with preheated fluidizing gas, such as hydrogen or helium into the fluidized bed reactor. Heat for the silane decomposition reaction is supplied by conventional external heating elements in conjunction with the preheated gas. The fluidizing gas containing the silanes maintains the bed of pure silicon seed particles in a fluidized state. The silanes present in the fluidizing gas thermally decompose within the fluidized bed reactor and are deposited on the seed crystals as opposed to the reactor side walls or other surfaces.

As the silicon seed particles grow within the fluidized bed, the heavier particles migrate to the lower portion of the fluidized bed where they are removed for further processing as a highly pure silicon product. This method provides a relatively energy effecient process for producing the high purity silicon required in solar arrays.

The continuous removal of silicon seed particles after they have grown to the desired size results in the depletion of the fluidized bed. In order to maintain a continuous bed of silicon seed particles within the reactor, it is necessary to continually introduce additional silicon seed particles into the fluidized bed to replace those removed as part of the ultra pure silicon product.

This necessity of providing a continuous supply of ultra pure silicon seed particles to the fluidized bed reactor presents a serious problem to which no adequate solution has yet been found. For example, methods utilized for producing silicon seed bed particles in the silicon fluidized bed processes being developed recently involve one of two techniques or a combination thereof. One of these processes involves crushing, classifying and cleaning ultra pure silicon into appropriately sized silicon seed particles. A hammer mill as well as jaw, cone or roller crushers are utilized to reduce the bulk silicon to a specific particle size distribution suitable for use as seed particles. The crushing and classifying process is not only expensive and time consuming but also presents severe contamination problems. In addition the crushing produces a highly acicular seed particle which presents an undesirable surface for efficient silicon deposition. Procedures to process the acicular seed particles into a more uniform shape involve dry tumbling or wet tumbling in the presence of water or methanol. Possiblities for contamination and long tumbling times render this type of procedure undesirable.

The other process for producing silicon seed particles is not plagued with the above mentioned problems inherent in crushing and grinding processes, but it also presents significant problems of its own. This process involves the recycling of appropriately sized seed particles which are generated in the fluidized bed reactor and removed along with the larger silicon product particles or entrained overhead in fluidizing gas exiting the reactor. In the reactor, a certain amount of silicon crystallizes spontaneously to form so-called homogeneous particles, while the majority of the silicon formed through thermal decomposition undergoes heterogeneous crystallization on the surface of the seed silicon particles. These homogeneous silicon particles form the bulk of the silicon particles recycled back into the reactor as seed particles.

In general, there is not a sufficient amount of appropriately sized homogeneous particles produced during normal reactor operations to supply the entire demand for new seed particles in the fluidized bed. This requires that the recycled stream of homogeneous particles be supplemented by seed particles produced by crushing or grinding. In addition, and more importantly, these homogeneously formed silicon particles tend to be amorphorous or not-dense in nature and present a very undesirable surface for elemental silicon deposition.

It is apparent that there is a present need for a method of providing a continuous supply of appropriately sized suitable silicon seed particles without the problems inherent in the above two discussed processes. Until a convenient, economical and suitably pure source of silicon seed particles is found, the fluidized bed process for producing ultra pure silicon will be less than optimally desirable.

SUMMARY OF THE INVENTION

The present invention solves the above-mentioned problems of prior art silicon producing processes by providing a novel seed source means for supplying silicon seed particles to the fluidized reactor.

This novel seed source means includes a seed reactor for thermally decomposing a seed generating gas containing silicon to form precursor silicon seed particles. The seed reactor foregoes the need for undesirable crushing and grinding steps and additionally produces silicon seed particles which are uniformly shaped for desirable fluidization characteristics and elemental silicon deposition.

In general, the present invention comprises a primary fluidized bed reactor in combination with a silicon seed generating device. Means are provided for introducing silicon seed particles into the primary fluidized reactor zone. Means are also provided for introducing a fluidizing gas and a silicon containing gas into the primary fluidized reactor zone to maintain the silicon seed particles in a fluidized suspension. Means are also supplied for heating the primary fluidized reactor zone to a temperature sufficient to thermally decompose the silicon in the silicon-containing gas to elemental silicon for deposition on the silicon seed particles. In addition means are included for removing excess fluidizing gas, unreacted silicon containing gas, reaction by-product gases and any entrained silicon particles therein from the primary fluidized reactor zone. Finally means are provided for removing silicon seed particles having thermally decomposed silicon products thereon from the primary fluidized reactor zone.

As the silicon seed particles having thermally decomposed silicon products thereon are removed from the primary fluidized reactor zone, the amount of silicon seed particles present is depleted and must be continuously replenished. The present invention provides a novel seed source means for supplying new silicon seed particles to the primary fluidized reactor zone to replace seed particles removed as product. The seed source means of the present invention is also based on thermal decomposition of silicon containing gases and therefore bypasses the undesirable crushing and grinding steps inherent in prior art methods for producing silicon seed particles. In addition, the silicon seed particles produced by the thermal decomposition process of the present invention does not produce undesirable pourous silicon seed particles or seed particles having acicular properties such as those found in silicon seed particles produced by prior art methods.

These and many other features and attendant advantages of the present invention will become apparent as the invention becomes better understood by reference to the following detailed description when considered in conjunction with the accompanying drawings.

DETAILED DESCRIPTION OF THE PREFERRED EXEMPLARY EMBODIMENTS

Figure 1:
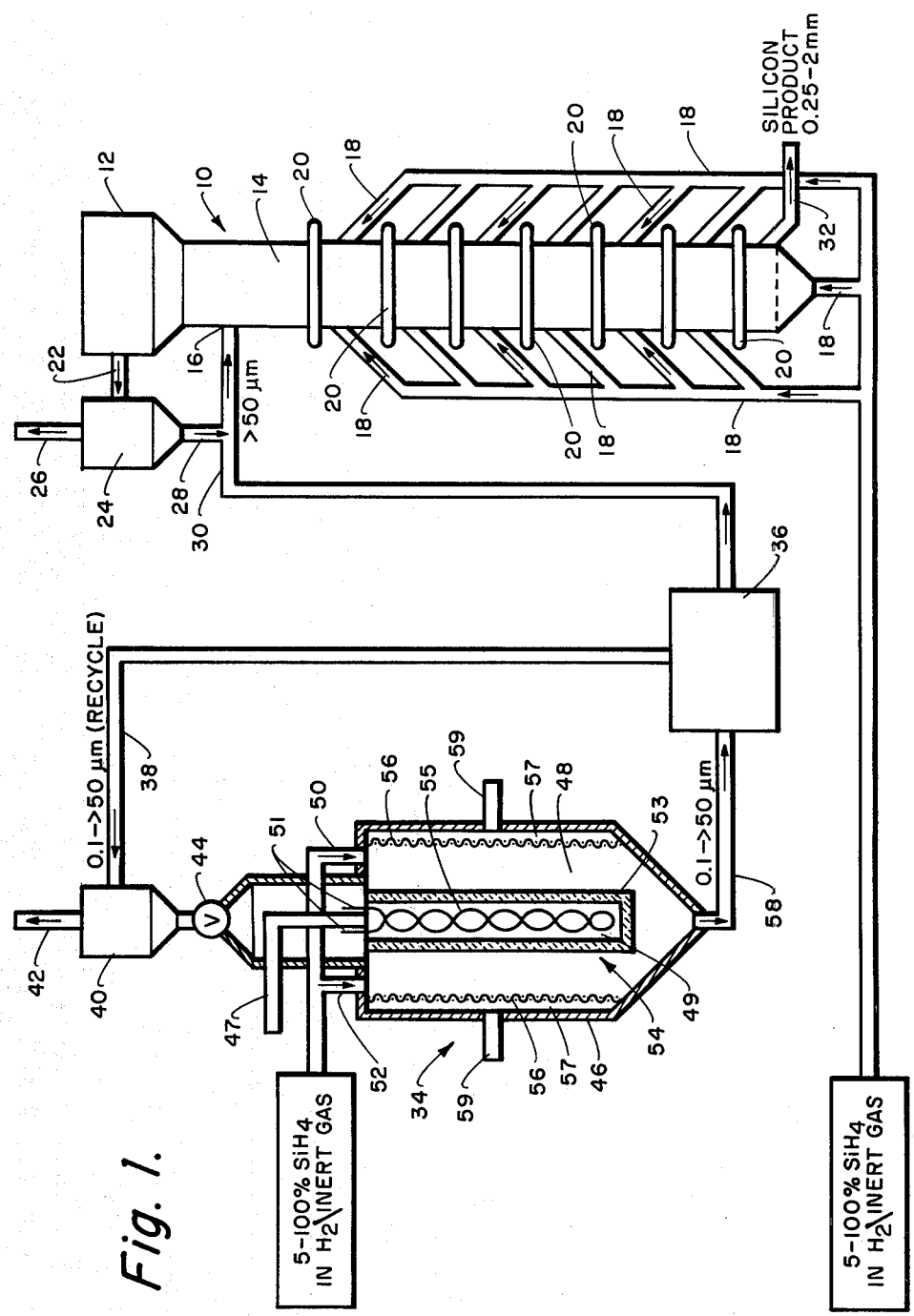
FIG. 1 is a diagrammatic representation of a first preferred exemplary embodiment of the present invention.
Figure 2:
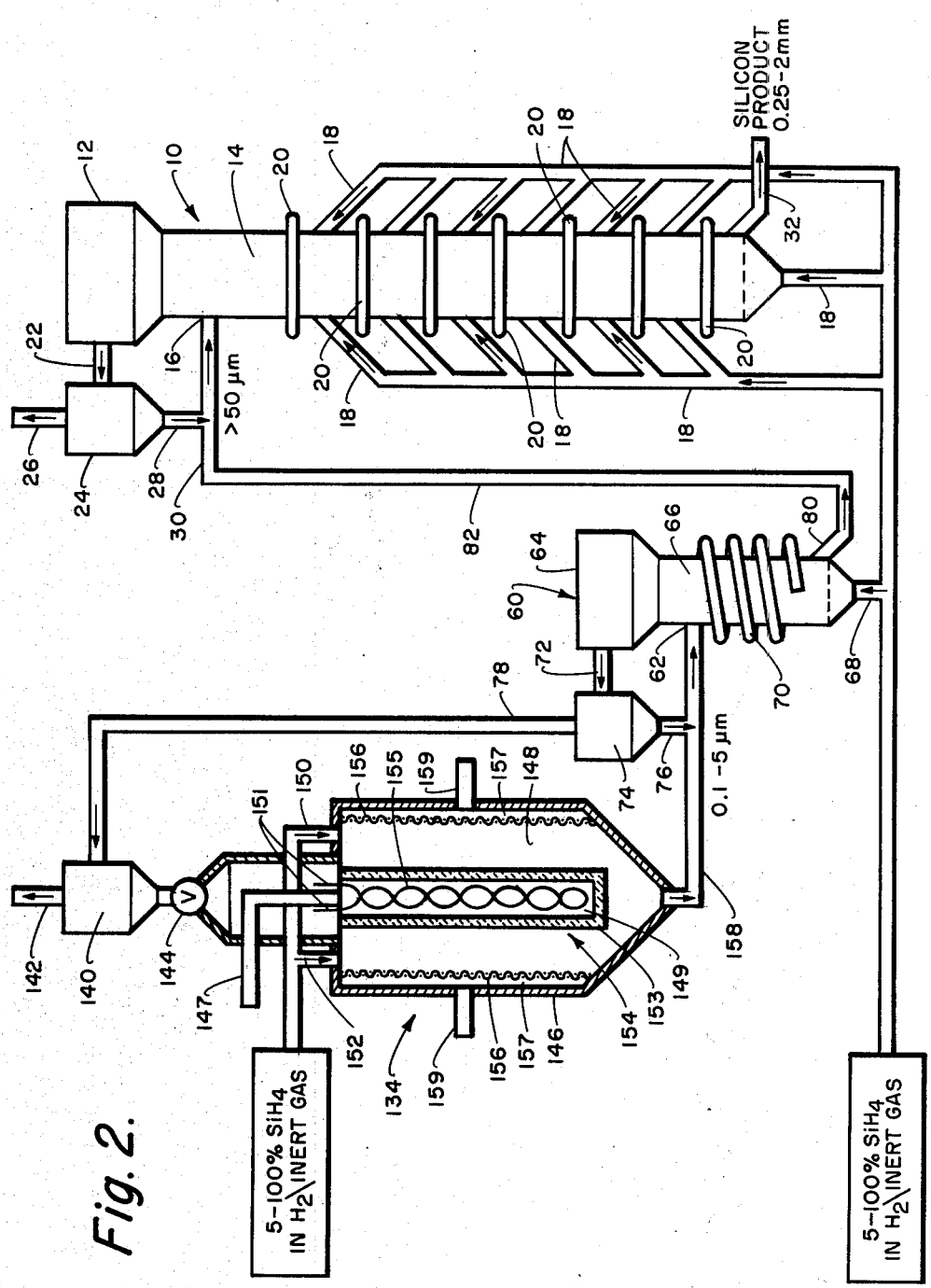
FIG. 2 is a diagrammatic representation of a second preferred exemplary embodiment of the present invention.

The present invention deals with a new method and apparatus for producing silicon seed particles for introduction into a fluidized bed reactor utilized in producing ultra-pure silicon. As shown in FIGS. 1 and 2, there are two preferred apparatuses and methods for thermally producing the silicon seed particles. The primary fluidized bed reactor which receives the silicon seed particles from either of the two preferred embodiments of the present invention is the same for both embodiments. Therefore, the primary fluidized bed reactor will be discussed generally followed by a detailed discussion of each of the two preferred embodiments of the present invention for supplying silicon seed particles to the primary fluidized bed reactor.

A primary fluidized bed reactor is shown generally at 10 in both FIGS. 1 and 2. The primary fluidized bed reaction 10 is of the type known in the art of ultra-pure silicon production by thermal deposition of elemental silicon on fluidized silicon seed particles. The actual dimensions and operating parameters of the primary fluidized bed reactor 10 are not critical and, in general, are known in the art.

For example, the primary fluidized bed reactor 10 includes a reactor shell 12 which defines a primary fluidized reactor zone 14. The reactor zone dimensions may vary from a cylinder having a diameter of between about $\frac{1}{4}$ inch to 4 feet and a heighth of between about 6 inches and 9 feet. The reactor shell 12 may be composed of any suitable inert material such as stainless steel, silicon carbide and preferably quartz. The reactor shell material should be inert at the temperatures of silicon decomposition (i.e. 400° to 1200° C.).

Means for introducing silicon seed particles into the primary fluidized reactor zone 14 is provided by silicon seed particle inlet 16. The silicon seed particles which are introduced through the seed particle inlet into the primary fluidized bed reactor zone 14 are maintained in a fluidized suspension by appropriate fluidizing gas. Means for introducing the fluidizing gas into the fluidized reactor zone 14 is provided by a plurality of upwardly directed gas inlets 18 provided in the sidewall of reactor 10. Of course, if desired the fluidizing gas may be introduced through less gas inlets and in a different position, such as only from the bottom; however, it is believed that a plurality of gas inlets 18 may increase the uniform fluidization of silicon seed particles and expand the reaction zone as the reaction rate is generally very fast.

Means for heating the primary fluidized reactor zone 14 are provided by heating coils 20. The heating coils 20 can comprise any convenient heat source known in the art for externally heating the primary fluidized reactor zone 14 to temperatures of silicon containing gas decomposition. It is important that the temperature of the primary fluidized reactor zone 14 be maintained at a temperature above the silicon decomposition point while still remaining below the temperature at which silicon melts to form a liquid. This temperature range is generally between about 400° to 1200° C. for a silane system.

Gas inlets 18 can also provide a means for introducing silicon containing gas into the primary fluidized reactor zone 14. If desired the silicon containing gas can be introduced into the primary fluidized reactor zone 14 by way of gas inlets separate from the fluidizing gas inlet 18; however, it is preferred to premix the silicon containing gas with the inert fluidizing gas and introduce the gas mixture into the first fluidized bed reactor by way of gas inlets 18. The silicon containing gas may be any of the number of thermally decomposable silicon containing gases such as silicon halides or silane. In the present invention, the use of silane is preferred because it foregoes the need of catalysts utilized in thermal decomposition of many other silicon containing gases. The fluidizing gas may be any inert gas such as hydrogen or helium; however, hydrogen is preferred. Preferably, the fluidizing gas should contain between about 5% to 100% silane by volume when introduced through inlets 18 into the primary fluidized reactor zone 14.

Means are provided by outlet 22 for removing excess fluidizing gas, unreacted silane, reaction by-product gases inlcuding hydrogen and any entrained silicon particles therein from the primary fluidized reactor zone 14. During thermal decomposition of the silane gas within the primary fluidized reactor zone 14, a certain amount of fine silicon dust is produced. These fine silicon particles are entrained in the exhaust gases and removed via outlet 22 and transferred to a cyclone separator 24. The cyclone separator vents the exhaust gases as shown by arrow 26 and recycles the fine silicon particles ranging in size from approximately a micron up to more than 50 microns back into the primary fluidized reactor zone 14 through recycle conduit 28 and inlet conduit 30.

Means are provided by product outlet 32 for removing silicon product particles from the primary fluidized reactor zone 14. The continually growing silicon seed particles migrate towards the bottom of the primary fluidized reactor zone 14 and eventually become so large that they are less fluidizable and thus segregated from the bottom of the reactor. These less fluidizable silicon particles having elemental silicon thermally deposited thereon are then removed from the bottom of the primary fluidized reactor zone via product outlet 32.

The continual removal of silicon particles from the primary fluidized bed reactor zone 14 results in a gradual depletion of silicon particles within the primary fluidized reactor zone 14. It is essential to continuous operation of this fluidized bed process that new silicon seed particles be continually introduced into the primary fluidized bed reactor zone 14. It is to the two preferred embodiments of the present invention for producing such silicon seed particles that the remainder of the detailed description is directed.

The first preferred seed source means for supplying silicon seed particles to the fluidized bed reactor 10 is shown in FIG. 1 comprising two basic elements. These elements are the pyrolysis seed reactor or free space reactor shown generally at 34 and separator 36. The basic function of the pyrolysis seed reactor 34 is to thermally decompose a silicon containing gas to homogeneously and heterogeneously form precursor silicon seed particles ranging in diameter from 0.1 microns to in excess of 50 microns. The basic function of separator 36 is to separate and classify these precursor silicon seed particles into particles having a diameter greater than or equal to 50 microns and particles having diameters less than 50 microns. The precursor silicon seed particles having diameters greater than or equal to 50 microns are passed via inlet conduit 30 to the first fluidized reactor zone 14. The silicon particles having diameters less than 50 microns are recycled back to the pyrolyzer seed reactor 34 by conduit 38. Prior to reintroduction into the pyrolysis seed reactor 34, the silicon particles are separated from the gas in which they are entrained by particle feeder-separator 40. The separated off gases are vented as shown by arrow 42. The amount of silicon particles recycled back into the pyrolysis seed reactor is controlled by valve 44.

The pyrolysis seed reactor 34 includes pyrolyzer shell 46 which defines the pyrolysis seed reactor zone 48. The pyrolyzer shell 46 may be composed of a variety of heat resistant materials; however $\frac{1}{4}''$ stainless steel is preferred. Means are provided by inlets 50 and 52 for introducing a seed generating gas containing silicon into the pyrolyzer seed reactor zone 48. The silicon containing gas can be any one of the thermally decomposable types including the silicon halides and silane. Silane is preferred. The seed generating gas may be diluted with up to 95% of an inert gas, preferably hydrogen. The usual composition of the seed generating gas is from between about 5 to 100% silane by volume in hydrogen gas.

Means for heating the pyrolysis seed reactor zone 48 is provided by porous thermowell shown generally at 54. The porous thermowell 54 is an elongated heating element which is disposed internally within the pyrolysis seed reactor zone 48. The porous thermowell 54 may be heated in any number of conventional ways including electrical resistance heaters.

Preferably the thermowell 54 includes a porous carbon cylinder 53 defining a central distributor space 49 inside which is disposed a double helix heating element 55. The heating element is preferably composed of silicon carbide and is provided with leads 51 for connection to an appropriate power source. The porous thermowell 54 must be capable of heating the pyrolysis seed reactor zone to the desired thermal decomposition of silicon, temperatures generally in the range of 400° C. to 1200° C.

An important aspect of the porous thermowell 54 is that the porous surface of the thermowell must be constructed to allow an inert protective gas to be passed outwardly from the central distributor space 49 through the porous carbon cylinder 53. This outwardly passing inert gas provides a protective boundary adjacent the exterior surface of the thermowell 54 to prevent the contact of silicon or silane with the porous thermowell 54 surface. If the silicon or silane is allowed to contact the hot thermowell 54 surface, continuing silicon deposition could occur on the thermowell 54 thereby eventually rendering the pyrolysis seed reactor 34 useless. Preferably, the inert gas is passed into the central distributor space 49 by way of conduit 47. The inert gas is dispersed uniformly throughout the central distributor space 49 and passes outwardly through the porous carbon cylinder 53 to form a uniform protective gas boundary layer surrounding the carbon cylinder 53. Helium is the preferred gas due to its high heat capacity. As the helium is passed through the porous thermowell 54 and into the reactor zone 48, it carries heat with it to help provide uniform heating within the reactor zone 48.

The problem of silane or silicon contacting the hot thermowell surface is also presented with regards to the pyrolyzer shell 46. Accordingly, the interior surface of the pyrolyzer shell 46 is provided with a porous surface 56. The particular porous material which is used to form the porous surface 56 is not particularly critical, so long as, the material is refractory in nature and maintains its porous structure at elevated temperatures and does not affect the silane decomposition reaction.

Porous surface 56 is preferably a fine mesh stainless steel screen through which an inert gas, preferably argon is passed uniformly into the reactor zone 48 to provide a protective inert gas boundary. Outer wall distributor space 57 is provided between the pyrolyzer shell 46 and the porous surface 56 to permit uniform distribution of the inert gas to the porous surface 56. Inert gas inlets 59 are centrally located in the sidewall of the pyrolyzer shell 46 to provide inert gas to the distributor space 57. Of course, if desired a plurality of inert gas inlets can be used instead of just the two inlets 59 shown in this embodiment.

The precursor silicon particles produced in the pyrolyzis seed reactor zone 48 are removed from the bottom via line 58 and transferred to separator 36 where the above mentioned separation and classification takes place. The actual dimensions of the pyrolysis seed reactor 34 are not especially critical. In addition operating parameters such as silane and hydrogen gas flow rates, protective inert gas flow rates and operating temperatures can be established experimentally with different pyrolysis seed reactors having different sizes and configurations.

Preferably the pyrolysis seed reactor 34 is operated at as low a temperature as possible, for example 600°. Also smaller reactors are preferred. Adequate silicon production has been achieved using a pyrolysis seed reactor having an internal diameter of 5 inches and a length of 35 inches. Additionally, although the pyrolyzer seed reactor 34 and separator 36 are shown supplying silicon seed particles to only one primary fluidized bed reactor, it should be understood that a plurality of primary fluidized bed reactors could also be supplied with silicon seed particles from one pyrolysis seed reactor source.

The second preferred embodiment of the present invention is shown in FIG. 2. The same primary fluidized bed reactor 10 as was used in the first preferred embodiment is also used in the second preferred embodiment. The seed source means of the second preferred embodiment for supplying silicon seed particles to the primary fluidized bed reactor zone includes two basic elements. The primary element is the pyrolysis seed reactor shown generally at 134. The second basic element is the secondary fluidized reactor shown generally at 60. The pyrolyzer seed reactor 134 is similar to, if not identical, with the pyrolyzer seed reactor 34 of the first preferred embodiment. However, in this second preferred embodiment the second fluidized bed reactor 60 is substituted for separator 36.

Many of the silicon particles which are produced in the pyrolysis seed reactor 134 are very small, on the order of 0.1 microns to 10 microns. This makes it very difficult to fluidize them efficiently in a primary fluidized bed reactor. The secondary fluidized bed reactor 60 is therefore utilized as an intermediate fine particle fluidized bed reactor to increase the size range of the small silicon particles in order to feed the primary reactor. As was the case in the first preferred embodiment, the pyrolysis seed reactor 134 of the second preferred embodiment includes a pyrolyzer shell 146 defining a pyrolysis seed reactor zone 148. Silane and inert gas inlets are provided at 150 and 152. The pyrolysis seed reactor zone 148 is also heated by porous thermowell 154.

The thermowell 154 similarly includes a porous carbon cylinder 153 defining a central distributor space 149 inside which is disposed a double helix heating element 155. Leads 151 are provided for connecting the heating element 155 to an appropriate power source. The pyrolyzer shell 146 is also supplied with interior porous surface 156.

The porous surface 156 is again preferably a fine mesh stainless steel screen which is placed inwardly from the pyrolyzer shell 146 so as to leave an outer wall distributor space 157 therebetween. As with the first embodiment, inert argon gas is preferably passed through inlets 159 into the wall distributor space 157 and uniformly passed through the porous surface 156 into the reactor zone 148 to provide the desired inert gas protective boundary adjacent the porous surface 156. Likewise, helium is passed by way of conduit 147 into the central distributor space and passed outwardly through the porous carbon cylinder 153 to form the inert gas protective boundary surrounding the thermowell 154.

The precursor silicon seed particles are also passed out of the pyrolysis seed reactor zone 148 by way of outlet 158. Since in this preferred embodiment the precursor silicon seed particles are passed to the secondary fluidized bed reactor 60, the conditions within the pyrolysis seed reactor 134 may be reduced so that precursor silicon seed particles measuring between 0.1 microns and 5 microns in diameter are produced. These relatively small precursor silicon seed particles are then introduced into the secondary fluidized bed seed reactor 60 as shown at inlet 62. The purpose of the secondary fluidized bed reactor 60 is to thermally deposit elemental silicon on these relatively small (less than 5 microns) particles to produce larger appropriately sized silicon seed particles having diameters of 50 microns and above.

The secondary fluidized bed reactor 60 includes a reactor shell 64 which defines a secondary fluidized reactor zone 66. Means for introducing silane and inert gas are provided by inlet 68. Means for heating the secondary fluidized reactor zone 66 are provided by external heating coils 70. In general, the secondary fluidized bed reactor 60 will have dimensions smaller than the primary fluidized reactor. Due to the fact that the very small silicon particles are difficult to fluidize, special flow conditions are required in the secondary fluidized reactor zone 66. Hydrogen is the preferred fluidizing gas and silane is the preferred silicon containing gas. These two gases are preferably pre-mixed prior to entry into the secondary fluidized reactor zone 66. Preferably the composition of the combined silane and inert gas ranges from 5 to 100% silane by volume with hydrogen gas.

Means are also provided by way of outlet 72 for removing excess hydrogen fluidizing gas, unreacted silane, reaction by-product gases including hydrogen and any entrained silicon particles therein from the secondary fluidized reactor zone 66. These exhaust gases and entrained silicon particles are passed to cyclone separator 74. The cyclone separator 74 separates out the entrained silicon particles ranging in diameter from 0.1 to 5 microns and reintroduces them via line 76 to line 158 for introduction back into the secondary fluidized reactor zone 66. The overhead exhaust gases which may still contain some ultra-fine silicon particles are then passed out of the cyclone separator 74 through line 78 to the particle feeder-separator 140. As was the case in the first preferred embodiment, the particle-feeder separator 140 vents the exhaust gases through vent 142 and returns the ultra-fine (diameters less than 0.1 micron) particles to the pyrolyzer seed reactor zone 148 by way of valve 144.

Means are also provided by outlet 80 to remove precursor silicon seed particles having thermally decomposed silicon thereon from the secondary fluidized reactor zone 66. These particles have a diameter which is generally greater than or equal to 50 microns. These particles are then transferred via line 82 into the primary fluidized reactor zone 14. They are for the most part spherical in shape, non-pourous and provide a very desirable surface for deposition of elemental silicon from thermal decomposition of silane.

The actual dimensions, flow rates and operating temperatures are also not especially critical with regard to the secondary fluidized bed reactor 60. They may also be established according to the size of the secondary fluidized bed reactor 60 desired and according to differing configurations.

Having thus described two preferred embodiments of the present invention which disclose a new and improved seed source means for supplying silicon seed particles to a fluidized bed silicon reactor, it is apparent that obvious advantages are provided over prior art grinding and crushing techniques. For example, contamination problems inherent in grinding and crushing processes are eliminated. A spherical non-porous seed particle is also produced which does away with problems inherent in acicular particles and porous particles. Additionally, this new process for supplying silicon seed particles maximizes the use of silane gas by recycling even the minutest silicon particles.

Further, it should be noted by those skilled in the art that the within disclosures are exemplary only and that various other alternatives, adaptations and modifications may be made within the scope of the present invention. Accordingly the present invention is not limited to the specific embodiments as illustrated herein.

What is claimed is:

1. An apparatus for producing silicon by thermally decomposing a silicon containing gas in the presence of fluidized nucleating seed particles of silicon comprising:
   a primary fluidized bed reactor defining a primary fluidized reactor zone;
   seed particle introduction means for introducing seed particles of silicon into said primary fluidized reactor zone;
   means for introducing a fluidizing gas into said primary fluidized reactor zone to maintain said silicon particles in a fluidized suspension;
   means for introducing a silicon containing gas into said primary fluidized reactor zone;
   means for heating said primary fluidized reactor zone to a temperature sufficient to thermally decompose the silicon in said silicon containing gas to elemental silicon for deposition on said silicon seed particles;
   means for removing excess fluidizing gas, unreacted silicon containing gas, reaction by-product gases and any entrained silicon particles therein from said primary fluidized reactor zone;
   means for removing silicon seed particles having thermally decomposed silicon product thereon from said primary fluidized reactor zone; and
   seed source means for supplying silicon seed particles to said seed particle introduction means, said seed source means including seed reactor means for thermally decomposing a seed generating gas containing silicon to form precursor silicon seed particles, said seed reactor having porous walls defining a pyrolysis seed reactor zone;
   means for introducing said seed generating gas containing silicon into said pyrolysis seed reactor zone;
   protective gas means for passing an inert gas through said porous reactor walls to provide a protective inert gas boundary to prevent deposition of silicon on said porous reactor walls;
   means for heating said pyrolysis seed reactor to a temperature sufficient to thermally decompose said seed generating gas containing silicon to form precursor silicon seed particles including a heat generating element disposed internally within said pyrolysis seed reactor zone and including means for providing a protective, inert gas boundary surrounding said heat generating element to prevent contact of silicon with said heat generating element;
   means for removing said precursor silicon seed particles from said pyrolysis seed reactor zone; and
   means for transporting said precursor silicon seed particles to said seed particle introduction means for introduction into said primary fluidized reactor zone as said silicon seed particles.

2. The apparatus of claim 1 wherein said seed source means also includes seed particle separator means for separating precursor silicon seed particles produced by said seed reactor means into relatively large seed particles for introduction into said primary fluidized reactor zone and smaller silicon particles which are recycled back to said seed reactor.

3. The apparatus of claim 1 wherein said seed source means also includes fluidized seed reactor means comprising:

a secondary fluidized bed reactor defining a second fluidized reactor zone;
means for introducing precursor silicon seed particles from said seed reactor into said secondary fluidized reactor zone;
means for introducing fluidizing gas into said secondary fluidized reactor zone to maintain said precursor silicon seed particles in a fluidized suspension;
means for introducing a silicon containing gas into said secondary fluidized reactor zone;
means for heating said secondary fluidized reactor zone to a temperature sufficient to thermally decompose for deposition on said precursor silicon seed particles;
means for removing excess fluidizing gas, unreacted silicon containing gas, reaction by-product gases and any entrained silicon particles therein from said secondary fluidized reactor zone;
means for removing precursor silicon seed particles having thermally decomposed silicon thereon from said secondary fluidized reactor zone; and
means for transporting said precursor seed particles with deposited silicon thereon to said seed particle introduction means for introduction into said primary fluidized reactor zone as said silicon seed particles.

4. The apparatus of claim 3 wherein said secondary fluidized seed reactor means also includes second cyclone separator means for separating said entrained silicon particles from said fluidizing gas, unreacted silicon containing gas and reaction by-product gases removed from said secondary fluidized reactor zone and recycling said separated out entrained silicon particles back into said secondary fluidized reactor zone.

5. The apparatus of claim 1 wherein said seed reactor means comprises:

a pyrolysis seed reactor having porous walls defining a pyrolysis seed reactor zone;
a seed generating gas source consisting essentially of a thermally decomposable gaseous precursor of silicon;
means for introducing said seed generating gas containing silicon into said pyrolysis seed reactor zone;
protective gas means for passing an inert gas through said porous reactor walls to provide a protective inert gas boundary to prevent deposition of silicon on said porous reactor walls;
means for heating said pyrolysis seed reactor to a temperature sufficient to thermally decompose said seed generating gas containing silicon to homogeneously form and heterogeneously grow precursor silicon seed particles;
means for removing said precursor silicon seed particles from said pyrolysis seed reactor zone; and
means for transporting said precursor silicon seed particles to said seed particle introduction means for introduction into said primary fluidized reactor zone as said silicon seed particles.

6. The apparatus of claim 5 wherein said means for heating said pyrolysis seed reactor zone includes a heat generating element disposed internally within said pyrolysis seed reactor zone, said heat generating element being encompassed by a porous layer through which an inert gas is passed to provide a protective inert gas boundary for preventing contact of silicon with said porous surface encompassing said internally disposed heating element.

7. The apparatus of claim 5 wherein said seed source means also includes seed particle separator means for separating precursor silicon seed particles produed in said pyrolysis seed reactor zone into larger seed particles for introduction into said primary fluidized reactor zone and smaller silicon particles and further including recycle means for recycling said smaller particles back to said pyrolysis seed reactor zone.

8. The apparatus of claim 5 wherein said seed source means also includes fluidized seed reactor means comprising:

a secondary fluidized reactor defining a second fluidized reactor zone;
means for introducing precursor silicon seed particles from said pyrolysis seed reactor zone into said secondary fluidized reactor zone;
means for introducing fluidizing gas into said secondary fluidized reactor zone to maintain said precursor silicon seed particles in a fluidized suspension;
means for introducing a silicon containing gas into said secondary fluidized reactor zone;
means for heating said secondary fluidized reactor zone to a temperature sufficient to thermally decompose said silicon containing gas to elemental silicon for deposition on said precursor silicon seed particles;
means for removing excess fluidizing gas, unreacted silicon containing gas, reaction by-product gases and any entrained silicon particles therein from said secondary fluidized reactor zone;
means for removing precursor silicon seed particles having thermally decomposed silicon thereon from said second fluidized reactor zone; and
means for transporting said precursor seed particles with deposited silicon thereon to said seed particle introduction means for introduction into said primary fluidized reactor zone as said silicon seed particles.

9. The apparatus of claim 8 wherein said fluidized seed reactor means also includes second cyclone separator means for separating entrained silicon particles from said fluidizing gas, unreacted silicon containing gas and reaction by-product gases removed from said secondary fluidized reactor zone and recycling said separated out entrained silicon particles back into said secondary fluidized reactor zone.

10. The apparatus of claim 1 further including first cyclone separator means for separating said entrained silicon particles from said fluidizing gas, unreacted silicon containing gas and reaction by-product gases removed from said primary fluidized reactor zone and recycling said separated out entrained silicon particles back into said primary fluidized reactor zone.

11. The apparatus of claim 1 wherein said means for introducing fluidizing gas into said primary fluidized reactor zone includes a plurality of fluidizing gas inlets.

12. The apparatus of claim 1 wherein said means for introducing a silicon containing gas into said first fluidized reactor zone includes a plurality of silicon containing gas inlets.

13. An apparatus for producing silicon seed particles by thermally decomposing a seed generating gas containing silicon in gaseous non-particulate form only comprising:

a pyrolysis seed reactor having walls defining a pyrolysis seed reactor zone;

means for introducing said seed generating gas into said pyrolysis seed reactor zone;

protective gas means for providing an inert gas boundary adjacent said reactor walls to prevent contact of silicon with the reactor walls;

means for heating said pyrolysis seed reactor to a temperature sufficient to thermally decompose said seed generating gas containing silicon to homogeneously form and heterogeneously grow silicon seed particles including a heat generating element disposed internally within said pyrolysis seed reactor zone and including means for providing a protective, inert gas boundary surrounding said heat generating element to prevent contact of silicon with said heat generating element; and means for removing the relatively large silicon seed particles from said pyrolysis seed reactor zone.

14. The apparatus of claim 13 wherein said protective gas means includes porous reactor walls through which inert gas is inwardly passed to form said inert gas boundary.

15. The apparatus of claim 13 wherein said generating element is encompassed by porous layer through which inert gas is passed outwardly to provide said protective inert gas boundary surroundiing said heat generating element.

16. The apparatus of claim 15 wherein said inert gas passed through said porous layer encompassing said heat generating element has a high heat capacity to promote transfer of heat from said heat generating element into said pyrolysis seed reactor zone.

17. The apparatus of claim 16 wherein said inert gas is helium.

* * * * *